United States Patent [19]

Ishiyama et al.

[11] Patent Number: 5,592,329
[45] Date of Patent: Jan. 7, 1997

[54] CATADIOPTRIC OPTICAL SYSTEM

[75] Inventors: Toshiro Ishiyama, Tokyo; Yutaka Suenaga, Yokohama, both of Japan

[73] Assignee: Nikon Corporation, Tokyo, Japan

[21] Appl. No.: 187,484

[22] Filed: Jan. 28, 1994

[30] Foreign Application Priority Data

Feb. 3, 1993 [JP] Japan ................................. 5-016275
Feb. 12, 1993 [JP] Japan ................................. 5-023974

[51] Int. Cl.$^6$ .......................... G02B 17/00; G02B 5/30; G02B 5/10; G02B 3/00
[52] U.S. Cl. ........................ 359/399; 359/365; 359/366; 359/487; 359/727; 359/858
[58] Field of Search ..................................... 359/366, 365, 359/364, 727, 732, 738, 739, 399, 858; 35/487

[56] References Cited

U.S. PATENT DOCUMENTS

| | | | |
|---|---|---|---|
| 4,241,390 | 12/1980 | Markle et al. | 359/366 |
| 4,364,631 | 12/1982 | Arondel et al. | 359/366 |
| 4,747,678 | 5/1988 | Shafer et al. | 359/366 |
| 4,812,028 | 3/1989 | Matsumoto | 359/366 |
| 4,897,682 | 1/1990 | Kuwana | 359/227 |
| 5,323,263 | 6/1994 | Schoenmakers | 359/366 |

FOREIGN PATENT DOCUMENTS 61-29815  2/1986  Japan .

*Primary Examiner*—Thong Nguyen
*Assistant Examiner*—Mohammad Y. Sikder
*Attorney, Agent, or Firm*—Shapiro and Shapiro

[57] ABSTRACT

A catadioptric optical system includes, in succession from the object side, a first partial optical system having positive refractive power and for forming the primary image of an object, and a second partial optical system having positive refractive power and for forming a secondary image by light from the primary image, and at least one aperture stop may be provided in the optical path of the first partial optical system and at least one aperture stop may be provided in the optical path of the second partial optical system.

12 Claims, 11 Drawing Sheets

CATADIOPTRIC OPTICAL SYSTEM

BACKGROUND OF THE INVENTION

1. Field of the Invention

This invention relates to a catadioptric optical system suitable for projecting and transferring a circuit pattern on a mask onto a photosensitive substrate.

2. Related Background Art

An optical system suitable for projecting and exposing a mask pattern onto photoresist on a wafer when manufacturing an integrated circuit such as LSI is disclosed, for example, in U.S. Pat. No. 4,812,028. The optical system of FIG. 8 of this U.S. Pat. No. 4,812,028, as shown in FIG. 12 of the accompanying drawings (but with different reference characters), is designed to have a first partial optical system K1 having reflecting surfaces M1–M3 and for forming the primary image I1 of an object O, and a second partial optical system K2 having a reflecting surface M4 and for forming a reduced image (secondary image) I2 by the light from the primary image I1.

In such a catadioptric optical system, it is necessary to provide an aperture stop for limiting the marginal portion of a beam of light passing through the optical path in the optical system for the setting of the numerical aperture of the optical system and the setting of the positions of the entrance pupil and exit pupil of the optical system. In the catadioptric optical system shown in FIG. 12, the design is such that the positions of the reflecting surfaces M2, M4 provide an aperture stop, that is, the principal ray intersects the optical axis Ax in the reflecting surfaces M2, M4.

However, the provision of an aperture stop at the positions of the reflecting surfaces M2, M4 has led to a problem that the degree of freedom of the optical design of the catadioptric optical system is restricted. For example, in maintaining telecentricity, refractive power arrangement is determined so as to set the position of the entrance pupil and the position of the exit pupil at infinity, but if the position of the aperture stop is predetermined as described above, it may become impossible to make such an optical design that refractive power arrangement is primarily determined to provide a good imaging performance.

It is also conceivable to provide an aperture stop at any other position than the reflecting surfaces, but in the catadioptric optical system, the optical path is turned back by the reflecting surfaces and therefore, beams of light often overlap each other at the position of the aperture stop. If, all marginal portions of a beam of light are limited by a single aperture stop, there will arise a problem that the other beam of light (the beam of light turned back by the reflecting surfaces) is intercepted.

Also, in the catadioptric optical system shown in FIG. 12, no consideration has been paid to the prevention of flare and ghost. This leads to a problem that flare and ghost occur on the image plane (secondary image plane), thus reducing the imaging performance.

SUMMARY OF THE INVENTION

So, it is an object of the present invention to provide a catadioptric optical system having a high degree of freedom of optical design, and to provide a catadioptric optical system in which flare and ghost occurring from the catadioptric optical system are reduced to thereby improve the imaging performance.

To achieve the above object, a catadioptric optical system according to the present invention includes, in succession from the object side, a first partial optical system having positive refractive power and for forming the primary image of an object, and a second partial optical system having positive refractive power and for forming a secondary image by light from said primary image, and at least one aperture stop may be provided in the optical path of the first partial optical system and at least one aperture stop may be provided in the optical path of the second partial optical system.

In the catadioptric optical system constructed as described above, an aperture stop is disposed at a location in the optical path of the catadioptric optical system which has a degree of freedom of physical disposition to thereby limit a part of a beam of light, and an aperture stop differing from said aperture stop is disposed at another location to thereby partially limit the remainder of the beam of light which has not been limited by the preceding aperture stop. That is, without any limitation in the disposition of the aperture stops, the action of the aperture stops can be attained in the whole catadioptric optical system.

Thereby, there can be provided a catadioptric optical system which is very little limited in optical design. Further, aperture stops can be disposed even at a location whereat a plurality of optical paths overlap each other, without the optical paths being intercepted, and therefore a spatial surplus can be given in manufacturing the catadioptric optical system. Accordingly, in the catadioptric optical system according to the present invention, a desired numerical aperture can be obtained, and this leads to the possibility of providing a catadioptric optical system which can also achieve the maintenance of telecentricity.

If either a plurality of aperture stops having different aperture diameters are interchangeably provided or the design is such that aperture diameters are varied, the numerical aperture of the catadioptric optical system can be made variable.

Also, the catadioptric optical system according to the present invention is designed to include, in succession from the object side, a first partial optical system having positive refractive power and for forming the primary image of an object, and a second partial optical system having positive refractive power and for forming a secondary image by light from said primary image. A field stop having an opening of a predetermined shape is disposed at a location whereat the primary image is formed.

In the catadioptric optical system according to the present invention as described above, a field stop having an opening of a predetermined shape is disposed at the conjugate point (primary image plane) of the object surface and the secondary image plane and therefore, harmful light which does not contribute to imaging can be intercepted by this field stop. Accordingly, the influence of flare and ghost can be reduced and the imaging performance of the catadioptric optical system can be improved.

Also, the field stop is disposed at a location conjugate with the secondary image plane and therefore, the exposure range can be strictly prescribed. Further, if the shape of the opening in the field stop is changed, the adjustment of the exposure amount on the secondary image plane will become possible. If the shape of the field stop is made to correspond to the illuminance distribution on the object surface, there will also be the effect that the exposure amount on the secondary image plane can be made uniform.

Also, to achieve the above object, the catadioptric optical system according to the present invention is designed to include, in succession from the object side, a first partial optical system having positive refractive power and for forming a primary image, and a second partial optical system having positive refractive power and for forming a secondary image by light from the primary image. In the optical path of the catadioptric optical system, there is disposed stop means for partially intercepting a beam of light passing through this optical path.

In the catadioptric optical system of the above-described construction, a part of the beam of light passing through the catadioptric optical system can be intercepted and therefore, flare and ghost can be reduced and the pupil position can be arbitrarily set without resorting to the refractive power arrangement of the catadioptric optical system.

Thereby, there can be provided a catadioptric optical system having a high degree of freedom in optical design and a high imaging performance.

Other objects, features and benefits of the present invention will be fully understood from the following description of some embodiments of the invention.

DESCRIPTION OF THE PREFERRED EMBODIMENTS

Some embodiments of the present invention will hereinafter be described with reference to the accompanying drawings.

Figure 1:
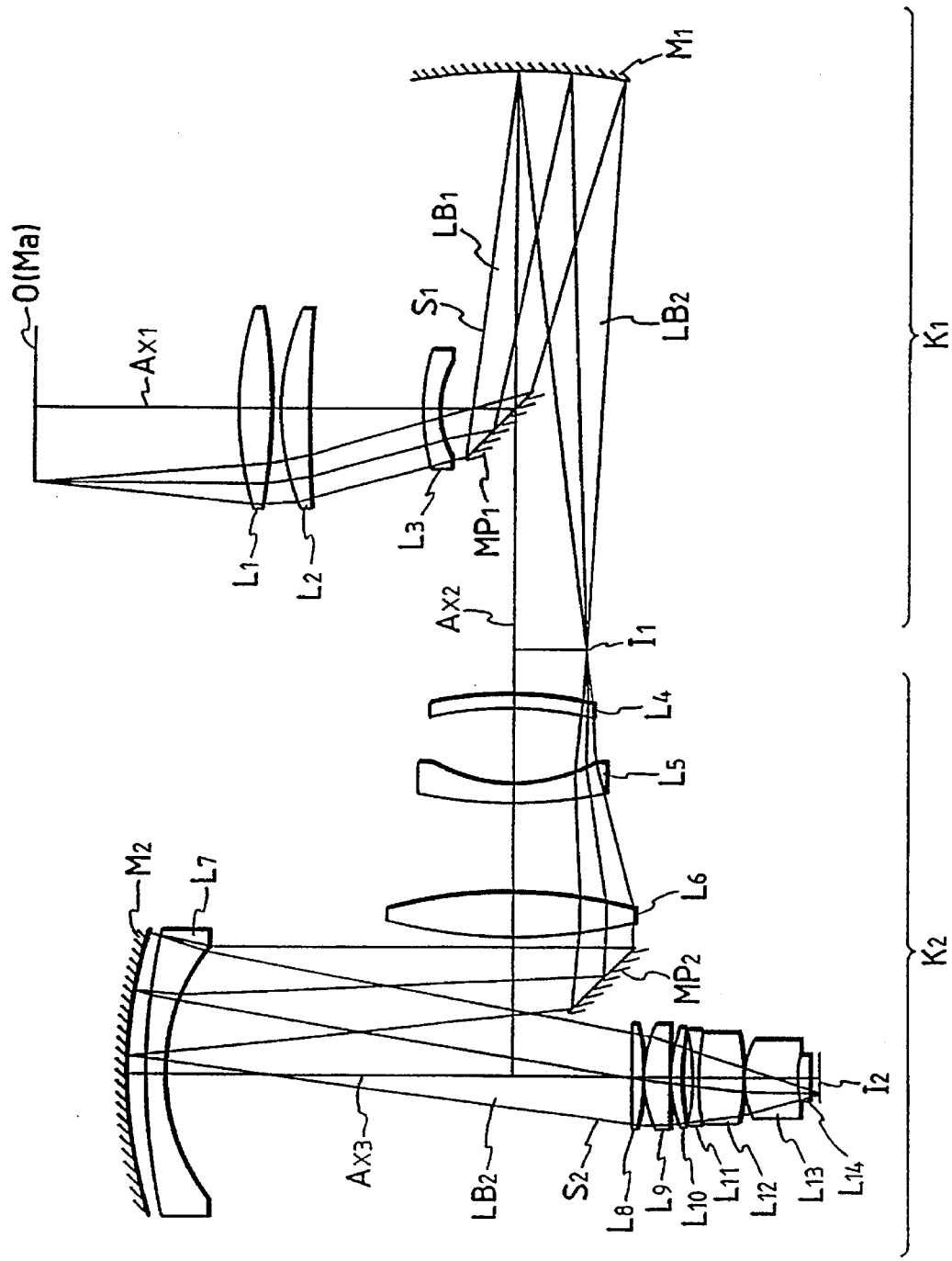
FIG. 1 shows the construction and optical path of a first embodiment of the present invention.
Figure 2A:
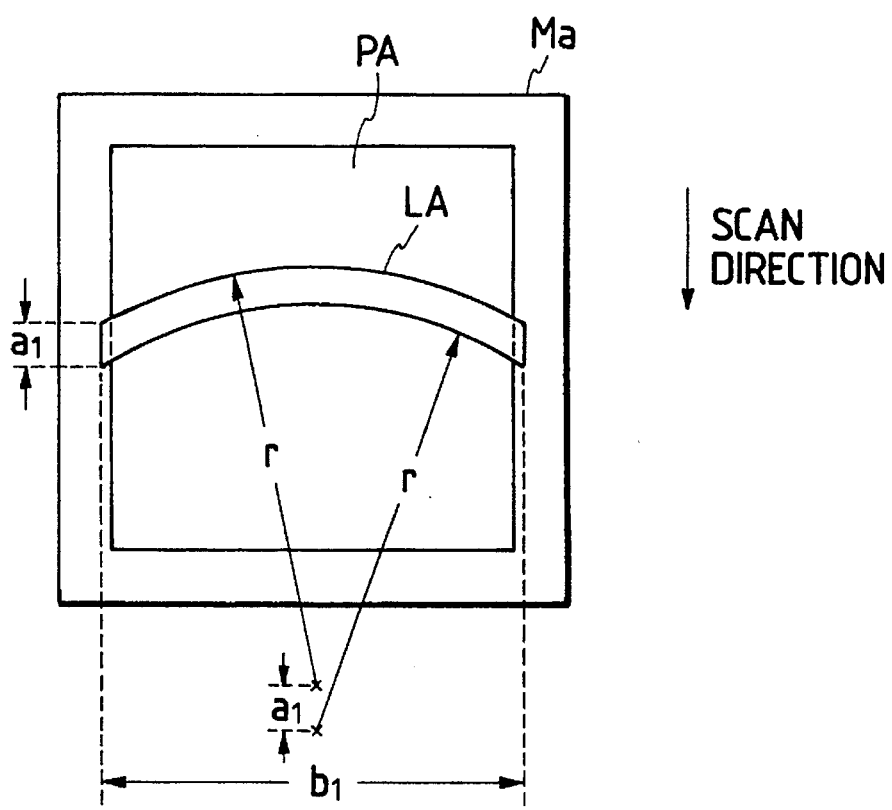
FIG. 2A is a plan view showing the shape of an illuminating area on an object surface.
Figure 2B:
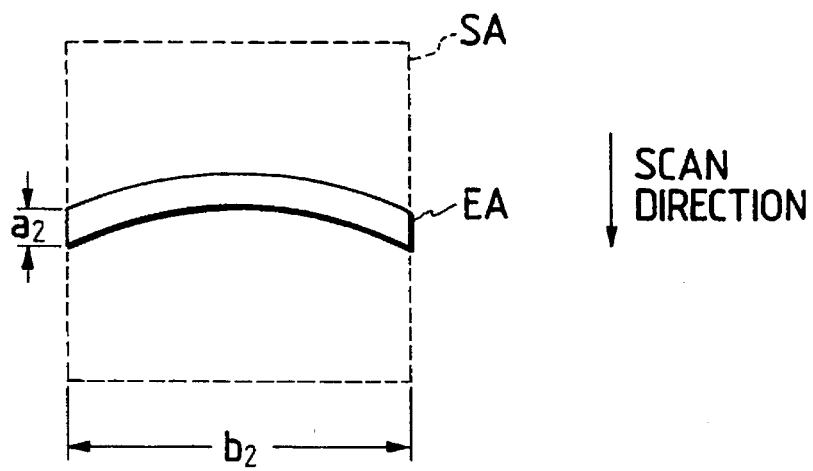
FIG. 2B is a plan view showing the shape of an exposed area on an image plane.

FIG. 1 shows the construction and optical path of a first embodiment in which a catadioptric optical system according to the present invention is applied to the projection optical system of a projection exposing apparatus. In FIG. 1, an illuminating optical system for illuminating an object surface O is not shown. As shown in FIG. 2A, a predetermined circuit pattern area PA is formed on a mask Ma as the object surface O, and this mask Ma and an arcuate illuminating area LA by the illuminating optical system, not shown, are moved relative to each other in the scan direction and illuminated. At this time, as shown in FIG. 2B, an arcuate exposed area EA which is the secondary image of the illuminating area LA is formed at the position of a secondary image I2 in FIG. 1. If a photosensitive substrate movable in the scan direction is provided at the location whereat this secondary image is formed, scanning exposure, i.e., projection exposure of the so-called step and scan type, can be realized. The shape of the above-mentioned exposed area EA is similar to the shape of the illuminating area LA.

In FIG. 2A, the arcuate illuminating area LA is an area defined by an arc of a predetermined radius r, an arc of the radius r parallel-moved from said arc by a distance $a_1$ in the scan direction, and straight lines having a spacing $b_1$ therebetween. The distance $a_1$ is called the slit width $a_1$ of the arcuate illuminating area LA, and the spacing $b_1$ is called the slit length $b_1$ of the illuminating area LA. A concentric circular area with a predetermined point as the center is also conceivable as the arcuate illuminating area, but this is not desirable because the exposure amount when scan exposure is effected differs between the center and the end portion of the exposed area.

Turning back to FIG. 1, the light from the mask surface (object surface O) illuminated by the illuminating area as described above is deflected by about 45° by a plane reflecting mirror MP1 through lens components L1–L3 disposed along an optical axis $Ax_1$, and is reflected by a first concave reflecting mirror M1 disposed along an optical axis $Ax_2$ perpendicular to the optical axis $Ax_1$ and having its concave surface facing the incidence side of the light. The primary image I1 of the object surface O is then formed on the reflection side of the first concave reflecting mirror M1. The lens components L1–L3 and the concave reflecting mirror M1 together constitute a first partial optical system K1.

The light from the primary image I1 is deflected by about 45° by a plane reflecting mirror MP2 through lens components L4–L6 disposed along the optical axis $Ax_2$. On the reflection side of the plane reflecting mirror MP2 (the emergence side of the light), a lens component L7 and a second concave reflecting mirror M2 are disposed along an optical axis $Ax_3$ perpendicular to the optical axis $Ax_2$ (i.e., parallel to the optical axis $Ax_1$), and the light emerging from the plane reflecting mirror MP2 is reflected by the second concave reflecting mirror M2 through the lens component L7, and thereafter travels toward lens components L8–L14 again through the lens component L7. These lens components L8–L14 have positive refractive power as a whole, and form the secondary image I2 which is the reduced image of the primary image I1 on a substrate by the light from the lens component L7. The lens components L4–L6, the lens component L7, the second concave reflecting mirror M2 and the lens components L8–L14 together constitute a second partial optical system K2.

Figure 3A:
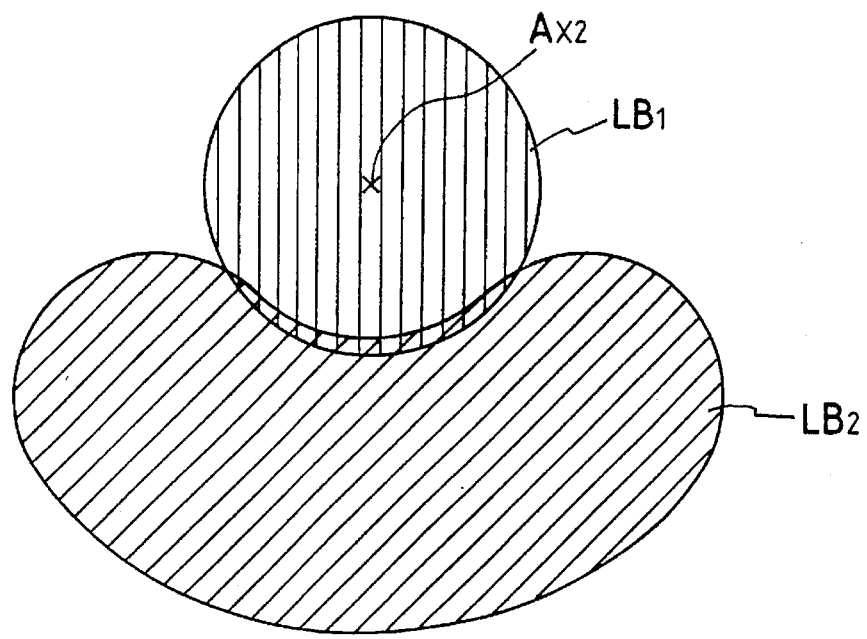
FIG. 3A is a plan view showing the cross-section of a beam of light at the position of the aperture stop of a catadioptric optical system according to the present invention.

Now, when a beam of light LB1 from the object surface O illuminated by the arcuate illuminating area arrives at an aperture stop S1 via the lens components L1–L3 and plane reflecting mirror MP1, the cross-section of the beam of light becomes substantially circular as shown in FIG. 3A. It is desirable to intercept the beam of light at the position of the aperture stop S1 so as to become circular, but at this position, the beam of light LB1 as described above passes and besides, a beam of light LB2 travelling from the first concave reflecting mirror M1 toward the primary image I1 passes. Therefore, by a conventional aperture stop having a circular opening therein, the beam of light LB1 cannot be effectively intercepted without the beam of light LB2 being intercepted.

Figure 3B:
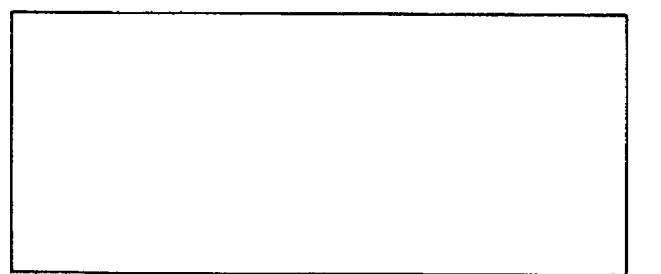
FIG. 3B is a plan view showing the cross-section of a beam of light at the position of the aperture stop of the catadioptric optical system according to the first embodiment.
Figure 3B:
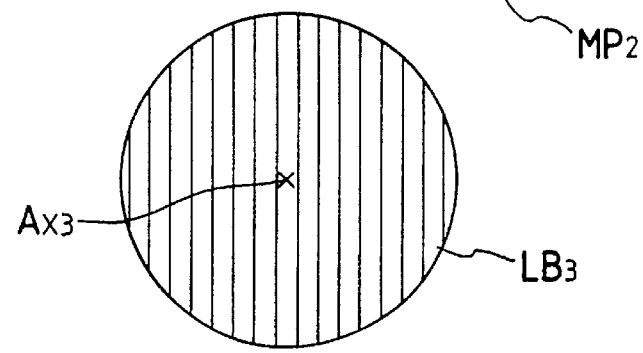

Also, when a beam of light LB3 travelling from the seventh lens component L7 toward the eighth lens component L8 in the second partial optical system K2 passes the position of an aperture stop S2, the cross-sectional shape of the beam of light becomes substantially circular. Here, it is conceivable to dispose a light intercepting frame having a circular opening therein at the position of the aperture stop S2, but as shown in FIG. 3B, the plane reflecting mirror MP2 is disposed near this position and there is no spatial surplus and therefore, a light intercepting frame having a circular opening therein cannot be provided there.

So, in the present embodiment, two different aperture stops S1 and S2 may be disposed at two locations in the optical path of the catadioptric optical system. Specifically, the aperture stop S1 having a substantially semicircular opening therein as shown in FIG. 4A is disposed near the pupil plane of the first partial optical system K1, and the aperture stop S2 having a substantially semicircular opening therein as shown in FIG. 4B is disposed near the pupil plane of the second partial optical system K2.

Figure 4A:
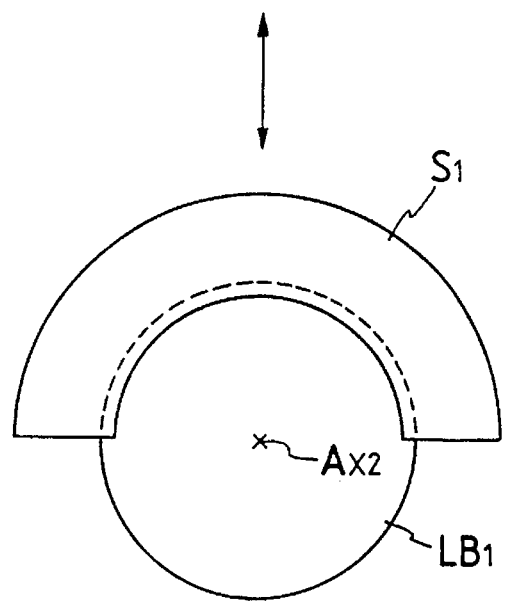
FIG. 4A is a plan view showing the shape of the aperture stop.
Figure 4B:
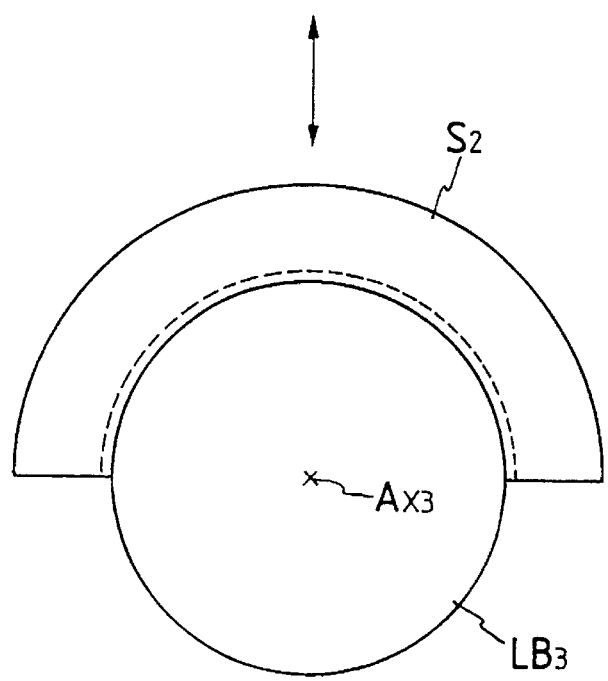
FIG. 4B is a plan view showing the shape of the aperture stop.

That is, as shown in FIG. 4A, that area of the marginal portion of the beam of light LB1 which does not overlap the beam of light LB2 indicated by broken line is intercepted (limited) by the aperture stop S1. When this partly limited beam of light LB1 reaches the position of the aperture stop S2, it becomes a beam of light LB3. The area of the beam of light LB3 which is not limited as indicated by broken line in FIG. 4B is intercepted (limited) by the substantially semicircular opening in the aperture stop S2.

It is desirable that the area limited by the aperture stop S1 and the area limited by the aperture stop S2 more or less overlap each other.

The aperture stops S1, S2 in the present embodiment are provided such that the numerical aperture at the object height (the distance from the optical axis $Ax_1$) 100 mm of the catadioptric optical system is 0.45 and both-side telecentricity is achieved.

Thus, according to the present embodiment, the beam of light passing through the catadioptric optical system is effectively limited by the aperture stop S1 provided in the first partial optical system K1 and the aperture stop S2 provided in the second partial optical system K2 and therefore, the disposition of these aperture stops S1 and S2 is limited in no way.

Also, even when it is physically difficult to dispose an aperture stop at an aperture stop position for maintaining telecentricity, an optical design which can maintain telecentricity well can be provide because the degree of freedom of the aperture stop position is great in the catadioptric optical system according to the present embodiment.

Figure 5:
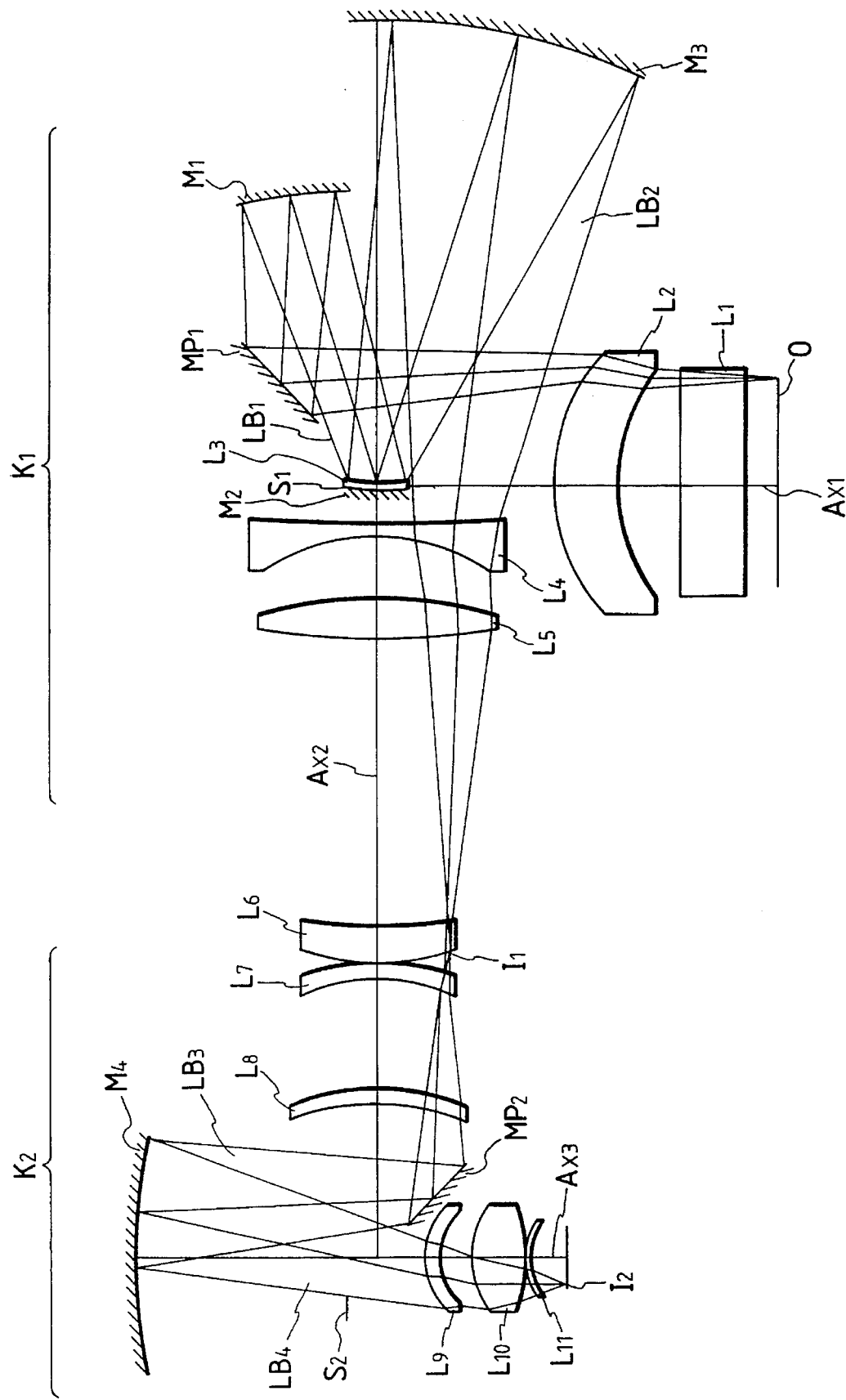
FIG. 5 shows the construction and optical path of a second embodiment of the present invention.

A second embodiment of the present invention will now be described with reference to FIG. 5. FIG. 5 shows the construction and optical path of the present embodiment. The present embodiment is one in which the running of the optical path of the catadioptric optical system disclosed in the second embodiment of U.S. Pat. No. 4,747,678 is changed to apply the present invention thereto.

Figure 6A:
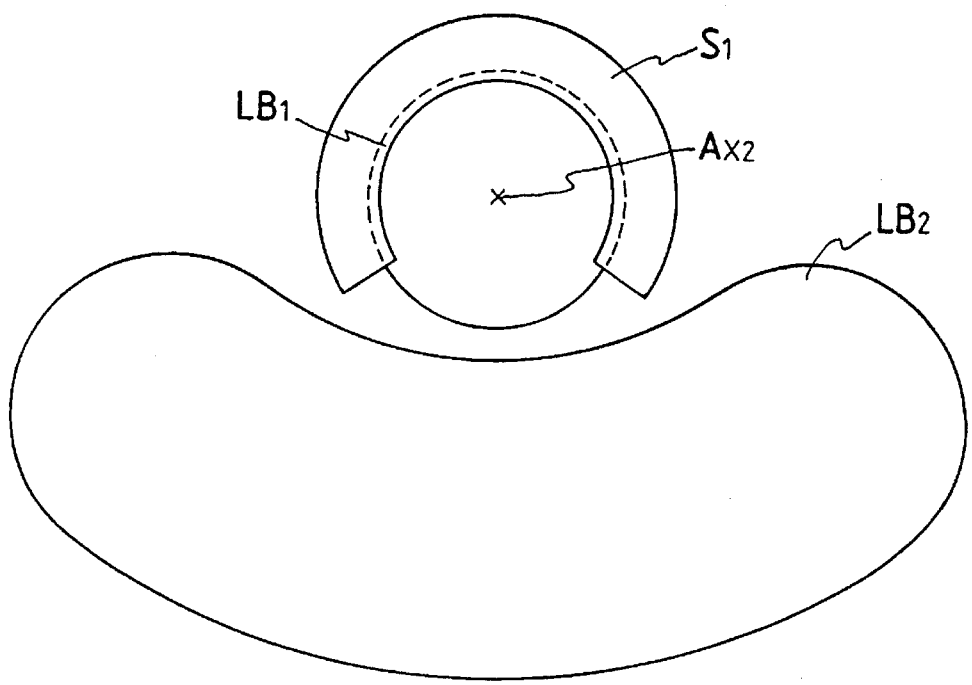
FIG. 6A is a plan view showing the cross-section of a beam of light at the position of the aperture stop of a catadioptric optical system according to the second embodiment and the aperture stop.

In FIG. 5, the beam of light from the object surface O is deflected by a plane reflecting mirror MP1 obliquely disposed at 45° with respect to the optical axis $Ax_1$, through lens components L1, L2 disposed along the optical axis $Ax_1$, and is reflected by a concave reflecting mirror M1 having the center of curvature on the optical axis $Ax_2$ perpendicular to the optical axis $Ax_1$ and having its concave surface facing the incidence side of the light. A lens component L3 and a convex reflecting mirror M2 having its convex surface facing the incidence side are disposed on the reflection side of the concave reflecting mirror M1, and the beam of light from the concave reflecting mirror M1 is reflected by the convex reflecting mirror M2 through a lens component L3, and travels again through the lens component L3 toward a concave reflecting mirror M3 disposed along the optical axis $Ax_2$ and having its concave surface facing the incidence side. An aperture stop S1 is disposed near the convex reflecting mirror M2 and intercepts (limits) that marginal portion of a beam of light LB1 travelling from the convex reflecting mirror M2 toward the concave reflecting mirror M3 which is adjacent to the aperture stop S1. The beam of light LB1 passing through the aperture stop S1 is then reflected by the concave reflecting mirror M3 and becomes a beam of light LB2 passing again the vicinity of the aperture stop S1. Accordingly, as shown in FIG. 6A showing the cross-section of the beam of light at the position of the aperture stop S1, the beam of light LB1 of substantially circular cross-section and the beam of light LB2 of arcuate cross-section are located near the aperture stop S1. The aperture stop S1 has a partly circular opening extending along about ⅔ of its circumference, and partly limits the most marginal portion of the beam of light LB1 without intercepting the beam of light LB2.

Turning back to FIG. 5, the beam of light LB2 having passed through the vicinity of the aperture stop S1 emerges from lens components L4, L5 disposed along the optical axis $Ax_2$ and forms the primary image I1 of the object near a lens component L6 also disposed along the optical axis $Ax_2$. The lens components L1, L2, the concave reflecting mirror M1, the lens component L3, the convex reflecting mirror M2, the concave reflecting mirror M3 and the lens components L4, L5 together constitute a first partial optical system K1.

Figure 6B:
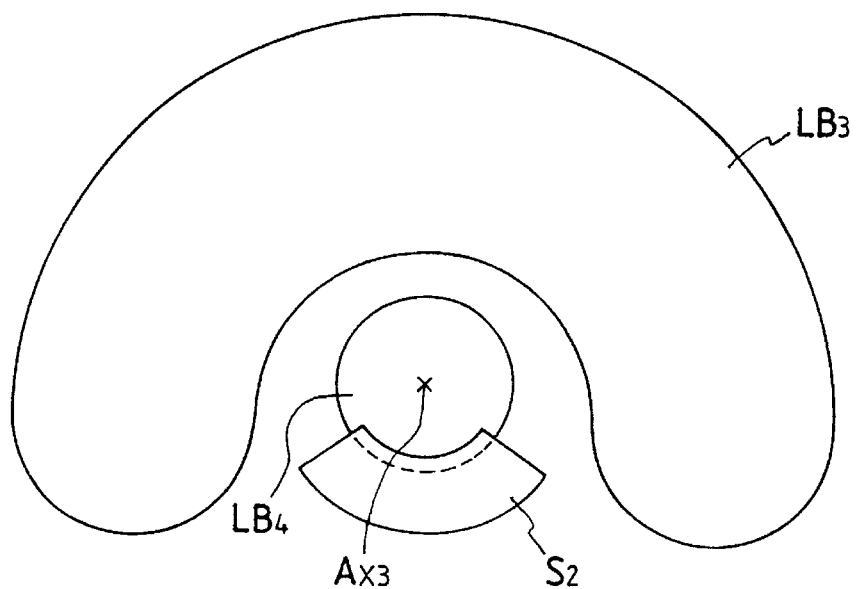
FIG. 6B is a plan view showing the cross-section of the beam of light at the position of the aperture stop of the catadioptric optical system according to the second embodiment and the aperture stop.

The beam of light from the primary image I1 is deflected by a plane reflecting mirror MP2 obliquely disposed at 45° with respect to the optical axis $Ax_2$, through lens components L6–L8, and becomes a beam of light LB3 which will travel toward a concave reflecting mirror M4 disposed along the optical axis $Ax_3$ perpendicular to the optical axis $Ax_2$. The beam of light LB3 is then reflected by the concave reflecting mirror M4 and becomes a beam of light LB4. An aperture stop S2 is disposed in the direction of travel of the beam of light LB4 (the reflection side of the concave reflecting mirror M4) and limits that marginal portion of the beam of light LB4 travelling from the concave reflecting mirror M4 toward a lens component L9 which is adjacent to the aperture stop S2. As shown in FIG. 6B, the beam of light LB3 passing through the vicinity of the aperture stop S2 has such an arcuate beam cross-section which covers the circumference of the beam of light LB4. Accordingly, the aperture stop S2 is designed to have a partly circular opening extending along about ⅓ of its circumference in order to limit the beam of light LB4 without intercepting the beam of light LB3. Thereby, it limits the area extending along about ⅓ of the most marginal portion of the beam of light LB4, i.e., the area which has not been limited by the aperture stop S1.

Turning back to FIG. 5, the beam of light passed through the aperture stop S2 passes through lens components L9–L11 disposed along the optical axis $Ax_3$ and forms on the exit side thereof a secondary image I2 which is the reduced image of the primary image I1 of the object. The lens components L6–L8, the concave reflecting mirror M4 and the lens components L9–L11 together constitute a second partial optical system K2.

Thus, the beam of light emerging from the catadioptric optical system has its whole marginal portion limited by the aperture stop S1 and the aperture stop S2. Accordingly, in the catadioptric optical system, it can be achieved to obtain a desired numerical aperture and to maintain both-side telecentricity. It is to be noted that the numerical aperture in the present embodiment is 0.35 at an object height 79 mm.

As described above, the catadioptric optical systems according to the first and second embodiments allow the aperture stops to be disposed in whatever running of the optical path. Thus, the beam of light passing through the catadioptric optical system is limited to thereby obtain a desired numerical aperture and at the same time, maintain telecentricity.

Also, in the first and second embodiments, if the design is such that the diameters of the openings in the aperture stops S1 and S2 are variable, the numerical aperture of the catadioptric optical system can be made variable. For example, the aperture stops S1 and S2 as shown in FIGS. 4A and 4B are provided so as to be movable in the directions of arrows (the directions along the cross-section of the beam of light). If the aperture stops S1 and S2 are moved so that the diameter of the beam of light passing through the openings in the aperture stops S1 and S2 may vary, the numerical aperture of the whole catadioptric optical system may be varied. Also, when varying the numerical aperture, a plurality of aperture stops having different opening diameters may be interchangeably provided.

In the above-described first and second embodiments, the shape of the openings in the aperture stops S1 and S2 may be partly circular. The entire periphery of the marginal portion of the beam of light can be limited as a result. The openings are not restricted to the semicircular openings and the ⅓ and ⅔ partly circular openings as shown in the above-described embodiments.

Also, while in the above-described first and second embodiments, two aperture stops are disposed in the partial optical systems K1 and K2, more than two aperture stops may of course be provided. For example, in a catadioptric optical system having a partial optical system for forming the primary image of an object, a partial optical system for relaying this primary image and forming a secondary image, and a partial optical system for relaying the secondary image and forming a tertiary image, an aperture stop can be disposed in each of the partial optical systems. In this case, the shape of the opening in the aperture stop in each partial optical system can be partly circular.

Figure 7:
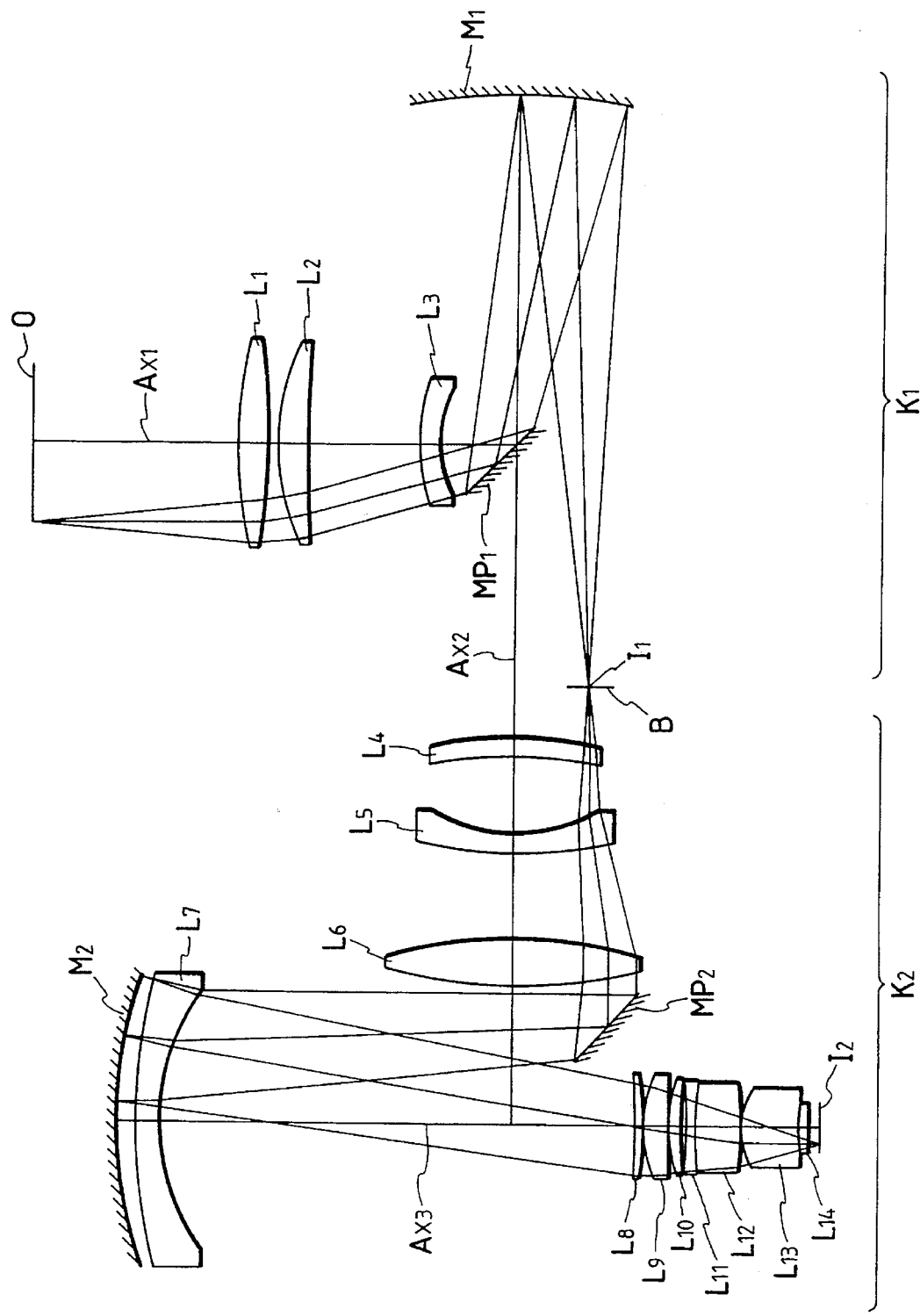
FIG. 7 shows the construction and optical path of a third embodiment of the present invention.

A third embodiment of the present invention will now be described with reference to FIGS. 7 to 10. FIG. 7 shows the construction and optical path of the third embodiment. The third embodiment is the catadioptric optical system according to the present invention as it is applied to the projection optical system of a projection exposing apparatus. In FIG. 7, an illuminating optical system for illuminating the object surface 0 is not shown.

As shown in FIG. 2A, a predetermined circuit pattern area PA is formed on a mask Ma as the object surface O as in the first embodiment, and this mask Ma and an arcuate illuminating area LA by the illuminating optical system, not shown, are moved relative to each other in the scan direction. At this time, the circuit pattern area PA on the mask Ma is illuminated by the arcuate illuminating area LA while being scanned.

Also, in the catadioptric optical system of FIG. 7, a photosensitive substrate having photoresist or the like applied to the surface thereof is provided at a location whereat a secondary image I2 is formed. As shown in FIG. 2B, the circuit pattern PA illuminated by the illuminating area LA is projected as an arcuate exposed area EA onto the photosensitive substrate by the catadioptric optical system. If at this time, the exposed area EA and the photosensitive substrate are moved relative to each other along the scan direction, scanning exposure, i.e., projection exposure of the so-called step and scan type, can be realized. By effecting this scanning exposure, a shot area SA is formed on the photosensitive substrate. The shape of the exposed area EA is similar to the shape of the illuminating area LA.

Turning back to FIG. 7, the light from the mask surface (object surface 0) illuminated by the illuminating area as described above is deflected by about 45° by a plane reflecting mirror MP1, through lens components L1–L3 disposed along the optical axis $Ax_1$, and is reflected by a first concave reflecting mirror M1 disposed along the optical axis $Ax_2$ perpendicular to the optical axis $Ax_1$ and having its concave surface facing the incidence side of the light. It then forms the primary image I1 of the object surface O on the reflection side of the first concave reflecting mirror M1. The lens components L1–L3 and the first concave reflecting mirror M1 together constitute a first partial optical system K1.

The light from the primary image I1 is deflected by about 45° by a plane reflecting mirror MP2 through lens components L4–L6 disposed along the optical axis $Ax_2$. On the reflection side of the plane reflecting mirror MP2 (the emergence side of the light), a lens component L7 and a second concave reflecting mirror M2 are disposed along the optical axis $Ax_3$ perpendicular to the optical axis $Ax_2$ (i.e., parallel to the optical axis $Ax_1$), and the light emerging from the plane reflecting mirror MP2 is reflected by the second concave reflecting mirror M2 through a lens component L7, and thereafter travels toward lens components L8–L14 again through the lens component L7. These lens components L8–L14 have positive refractive power as a whole, and form a secondary image I2 which is the reduced image of the primary image I1 on the substrate by the light from the lens component L7. The lens components L4–L6, the lens component L7, the second concave reflecting mirror M2 and the lens components L8–L14 together constitute a second partial optical system K2. The imaging magnification of the whole of the catadioptric optical system according to the present embodiment is a reduction magnification of ⅕ time.

Now, in the catadioptric optical system according to the present embodiment, a field stop B having an opening of a predetermined shape therein is disposed at a location whereat the primary image I1 is formed. The specific construction of this field stop B will hereinafter be described.

Figure 8:
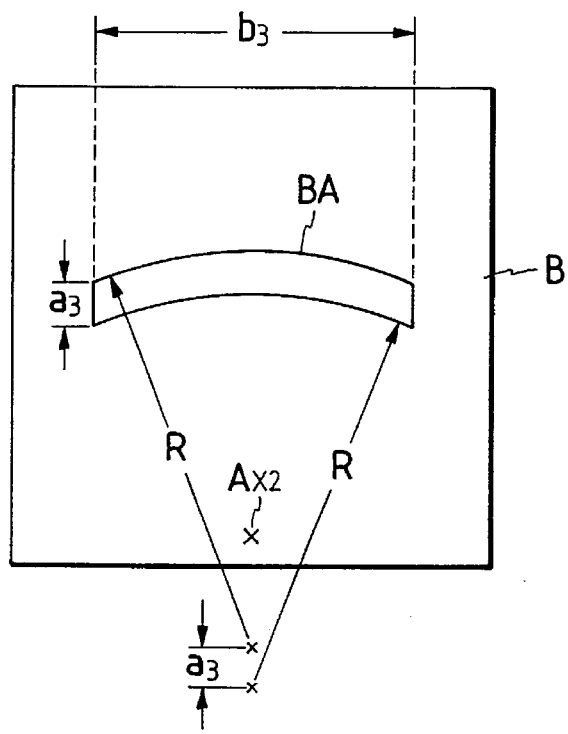
FIG. 8 is a plan view showing the construction of a field stop.

FIG. 8 is a plan view showing the shape of the opening in the field stop B. In FIG. 8, the arcuate opening BA is an area defined by an arc (partial circle) of a predetermined radius R, an arc parallel-moved by a predetermined distance $a_3$ from said arc, and straight lines having a predetermined spacing $b_3$ therebetween. The distance $a_3$ is called a slit width $a_3$, and the spacing $b_3$ is called a slit length $b_3$.

The light passing through the optical path of the catadioptric optical system which does not contribute to imaging (harmful light) does not pass through the opening BA in the field stop B and therefore does not arrive at the secondary image plane I2 (photosensitive substrate). Thereby, the image of the circuit pattern PA (secondary image) is formed with the influence of flare and ghost upon it reduced.

Also, by this field stop B, the exposed area EA formed on the shot area SA on the photosensitive substrate is accurately prescribed without the blur of its marginal portion being created.

The slit width $a_2$ of the exposed area EA shown in FIG. 2B is primarily determined by the slit width $a_3$ of the opening BA shown in FIG. 8. If the slit width $a_3$ of the opening BA is made variable, the slit width $a_2$ of the exposed area can be made variable.

Figure 9:
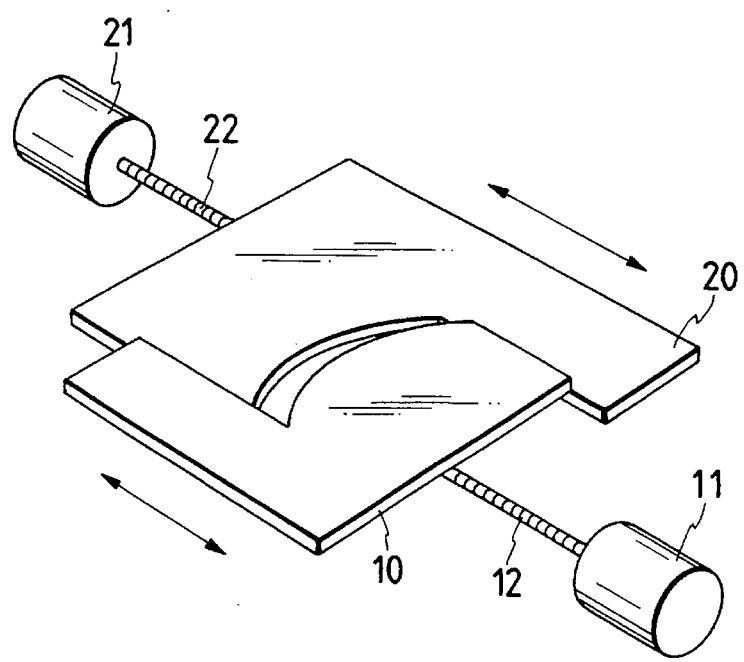
FIG. 9 is a schematic view showing the construction when the field stop is a movable stop.

Specifically, as shown in FIG. 9, the field stop B is constituted by a light intercepting member 10 having an arc Of a predetermined radius, and a light intercepting member 20 having an arc of the same radius as that of the arc of the light intercepting member 10. If the light intercepting member 10 is provided for movement in the direction of the arrow (the direction of the slit width) by a motor 11 and a feed screw 12 and the light intercepting member 20 is provided for movement in the direction of the arrow (the direction of the slit width) by a motor 21 and a feed screw 22, the slit width of the arcuate opening can be made variable. Thereby, it becomes possible to vary the slit width of the exposed area EA.

In the present embodiment, scanning exposure is effected while the photosensitive substrate and the exposed area are moved relative to each other and therefore, if the slit width of the exposed area EA is made variable, the exposure amount on the photosensitive substrate can be adjusted. In order to make the width of the opening in the field stop B variable, it is also conceivable, for example, to constitute the field stop B by a plurality of openings of different shapes arranged in the form of a turret, and dispose one of those openings at a location whereat the primary image I1 is formed. By such a technique as well, the shape of the opening in the field stop B can be made variable.

Figure 10A:
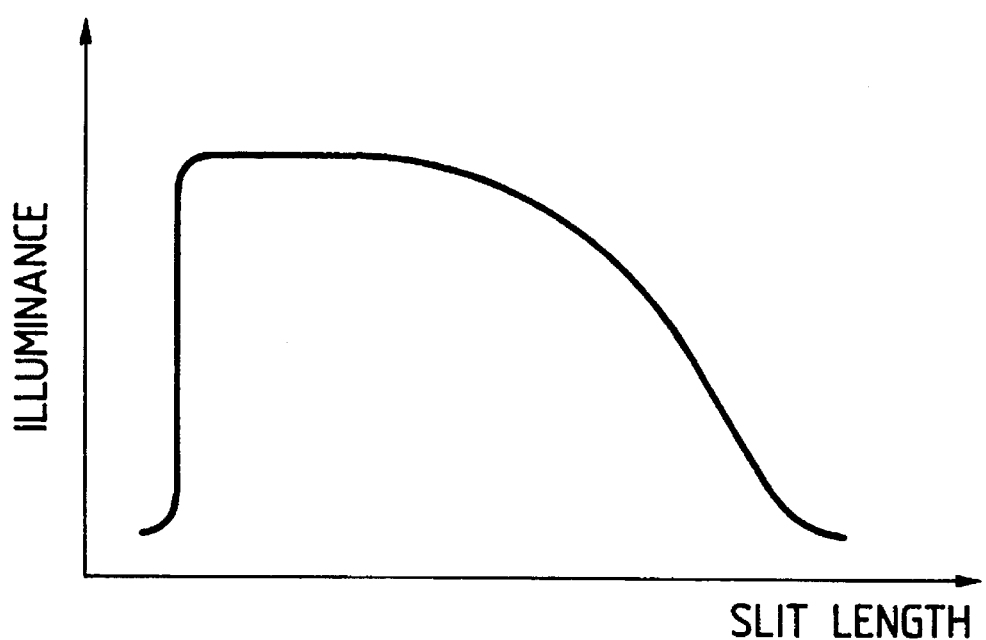
FIG. 10A shows an example of the illuminance distribution.
Figure 10B:
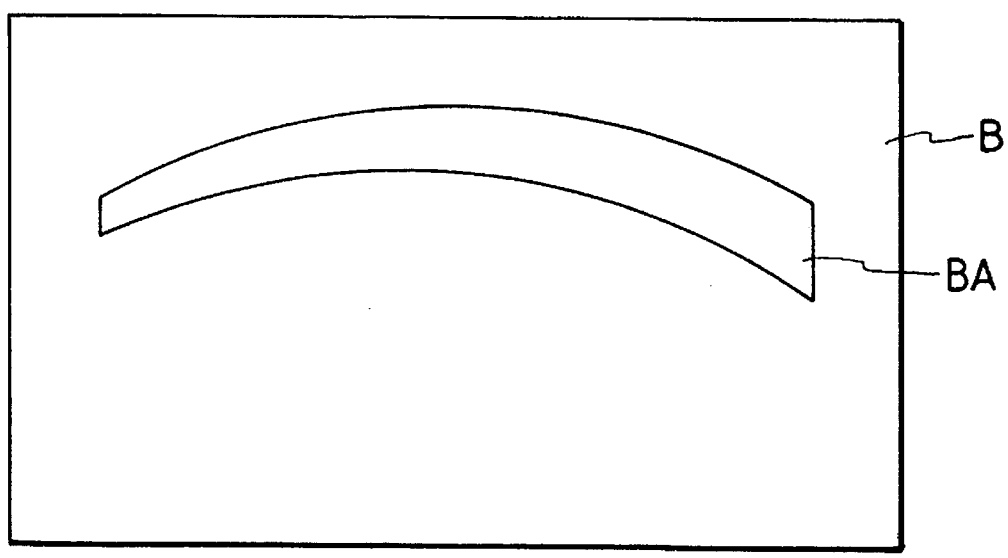
FIG. 10B is a plan view showing an example of the shape of the opening in the field stop corresponding to the illuminance distribution of FIG. 10A.

Also, if the uniformity of the illuminance in the illuminating area LA is bad, it will be desirable that the shape of the opening BA in the field stop B be made to match the illuminance distribution of the illuminating area LA. If as shown, for example, in FIG. 10A, the illuminating area LA is of an illuminance distribution in which the illuminance is reduced in the direction of the slit length (the direction orthogonal to the scan direction), use can be made of a field stop B having an opening BA of a shape as shown in FIG. 10B wherein the slit width differs at the opposite ends. Thereby, a uniform distribution of exposure amount can be obtained on the photosensitive substrate which is scanned and exposed.

Figure 11:
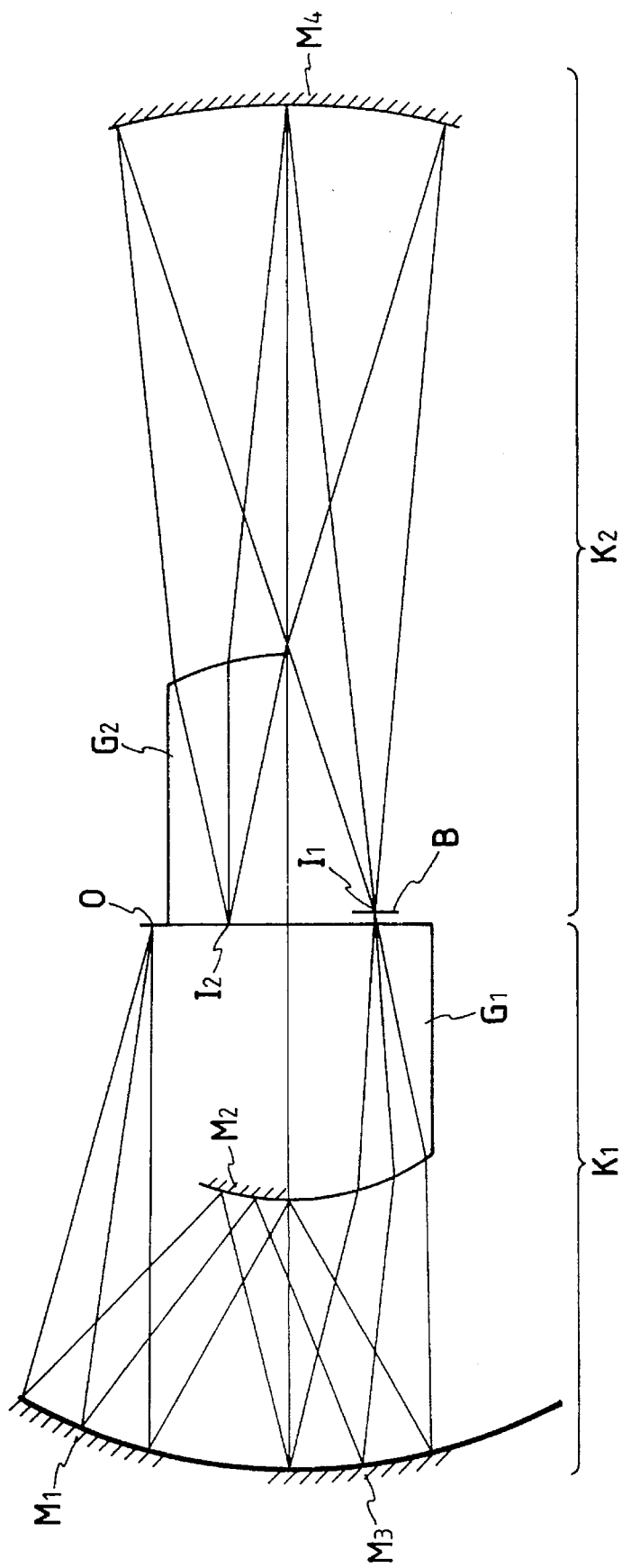
FIG. 11 shows the construction and optical path of a fourth embodiment of the present invention.
Figure 12:
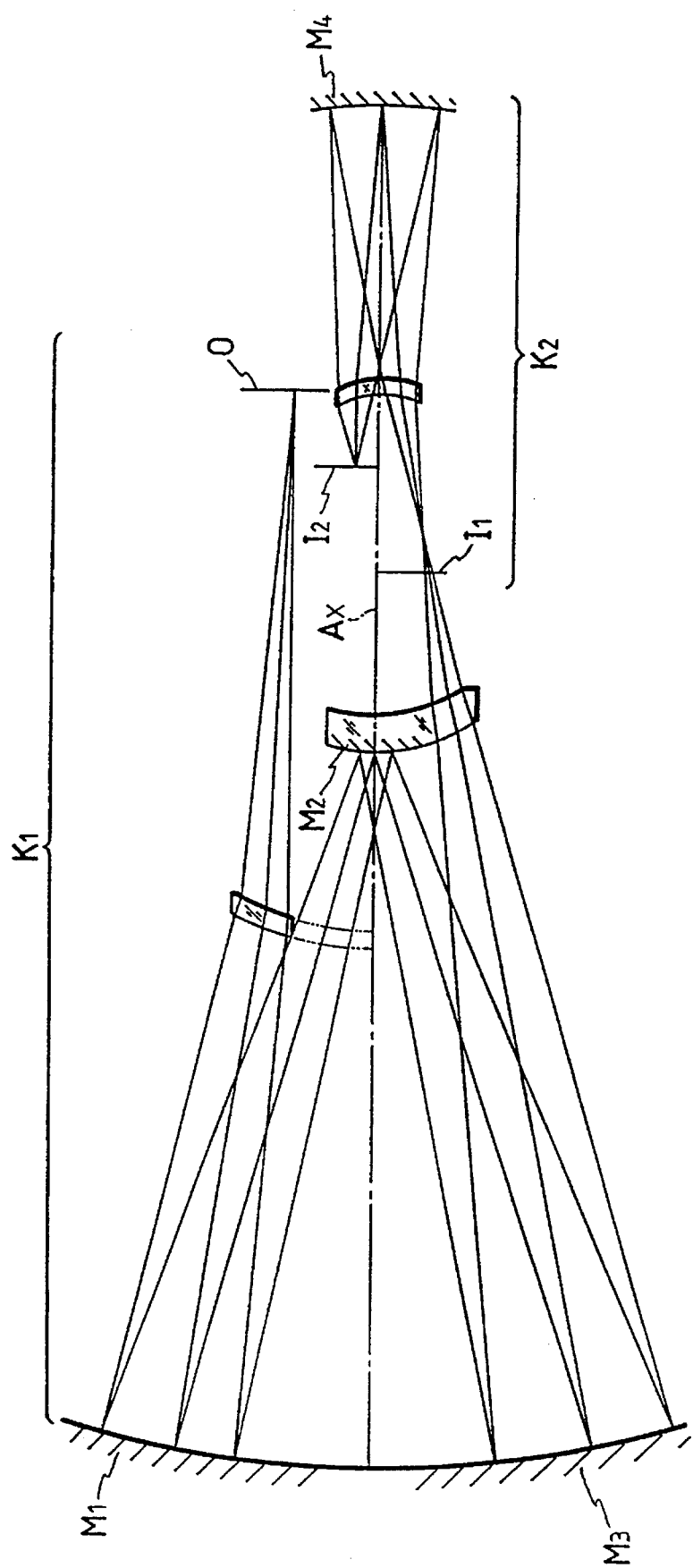
FIG. 12 shows the construction of a catadioptric optical system according to the prior art.

A fourth embodiment of the present invention will now be described with reference to FIG. 11. FIG. 11 shows the construction and optical path of the present embodiment. The present embodiment is one in which the present invention is applied to the catadioptric optical system disclosed in the first embodiment of Japanese Laid-Open Patent Application No. 61-29815.

In FIG. 11, the rays of light from the object surface O are successively reflected by a first concave mirror M1 and a first convex mirror M2 and reach a second concave mirror M3 of the same curvature as that of the first concave mirror M1. The rays of light reflected by the second concave mirror M3 pass through a first lens unit G1 and form a primary image I1 on the exit side of the lens unit G1. The first and second concave mirrors M1 and M3, the first convex mirror M2 and the lens unit G1 together constitute a first partial optical system K1.

The light from the primary image I1 formed by the first partial optical system K1 is reflected by a third concave mirror M4, and thereafter passes through a second lens unit G2 and forms a secondary image I2 on the exit side of the second lens unit G2. The third concave mirror M4 and the second lens unit G2 together constitute a second partial optical system K2. The imaging magnification of the whole of the catadioptric optical system according to the present embodiment is a reduction magnification of 1/2.25 time.

Again in the present embodiment, a field stop B having an opening of a predetermined shape therein is disposed at the location whereat the primary image I1 is formed by the first partial optical system K1. Harmful light which provides flare and ghost can be intercepted by this field stop B to thereby improve the imaging performance of the catadioptric optical system. Also, when the secondary image I2 and the photosensitive substrate are scanned as in the aforedescribed third embodiment, the width of the opening in the field stop B can be varied to thereby adjust the exposure amount on the secondary image plane I2. Further, if the shape of the opening in the field stop B is prescribed in accordance with the illuminance distribution of the illuminated area on the object surface O, the exposure amount on the secondary image plane I2 can be made uniform.

As described above, the field stop in the third and fourth embodiments of the present invention can be applied to any catadioptric optical system having a first partial optical system for forming the primary image of an object, and a second partial optical system for relaying the primary image and forming a secondary image.

Also, in the above-described third and fourth embodiments, one field stop B is disposed at the location whereat the primary image is formed, but the number of the field stops B is not limited to one. For example, where besides the first and second partial optical systems, there is provided a third partial optical system for relaying the secondary image formed by the second partial optical system and forming a tertiary image, two field stops may be disposed at two locations, i.e., the location whereat the primary image is formed and the location whereat the secondary image is formed.

The above-described embodiments are intended to clarify the technical substance of the present invention and the present invention is not restricted to such specific embodiments, but may assume various modifications within the spirit and scope of the invention as defined in the appended claims.

What is claimed is:

1. A catadioptric optical system including in succession from an object side:

a first partial optical system having positive refractive power and for forming a primary image of an object;

a second partial optical system having positive refractive power and for forming a secondary image by light from said primary image;

a first aperture stop disposed in an optical path of said first partial optical system; and a second aperture stop disposed in an optical path of said second partial optical system;

wherein a beam of light incident on said aperture steps, respectively, is partially intercepted thereby, and wherein each of said aperture stops is constructed to intercept only a marginal portion of a cross-section of the incident beam that extends over less than an entire periphery of said cross-section, the marginal portion partially intercepted by the first aperture stop and the marginal portion partially intercepted by the second aperture stop corresponding to different partial marginal portions of a light beam propagated through said first and second partial optical systems, each of said first and second aperture stops being part of a plurality of aperture stops which, together, intercept a marginal area that extends over substantially the entire periphery of a cross section of said propagated light beam.

2. A catadioptric optical system according to claim 2, wherein each of said first and second aperture stops has a partly circular opening therein.

3. A catadioptric optical system according to claim 1, wherein each of said first and second aperture stops is constructed so that the opening diameter thereof is variable.

4. A catadioptric optical system according to claim 3, wherein said a plurality of aperture stops have different opening diameters.

5. A catadioptric optical system according to claim 3, each of said first and second aperture stops has first and second light intercepting members each having an opening of a predetermined shape therein, said first and second light intercepting members being provided for movement in the cross-sectional direction of a beam of light intercepted by said first and second light intercepting members.

6. A catadioptric optical system according to claim 1, further including a field stop provided at a location whereat said primary image is formed and having an opening therein.

7. A catadioptric optical system according to claim 6, wherein said field stop is one of a plurality of field stops having openings of different shapes therein, and one of said plurality of field stops, is disposed at the location whereat said primary image is formed.

8. A catadioptric optical system according to claim 6, wherein the shape of said opening in said field stop is variable.

9. A catadioptric optical system according to claim 8, wherein said field stop includes a first light intercepting member for partly intercepting a beam of light passing through the location whereat said primary image is formed, and a second light intercepting member for partly intercepting the beam of light passing through the location whereat said primary image is formed.

10. A catadioptric optical system according to claim 9, wherein said first and second light intercepting members are provided for movement along the cross-sectional direction of the beam of light passing through the location whereat said primary image is formed.

11. A catadioptric optical system including in succession from an object side:

a first partial optical system having positive refractive power and for forming a primary image of an object; and a second partial optical system having positive refractive power and for forming a secondary image by light from said primary image;

at least one aperture stop being provided in the optical path of said first partial optical system, and at least one aperture stop being provided in the optical path of said second partial optical system;

wherein a beam of light incident on said aperture stops, respectively, is partially intercepted thereby, and wherein each of said aperture stops is constructed to intercept only a marginal portion of a cross-section of the incident beam that extends over less than an entire periphery of said cross-section, the marginal portion partially intercepted by the first aperture stop and the marginal portion partially intercepted by the second aperture stop corresponding to different partial marginal portions of a light beam propagated through said first and second partial optical systems, each of said first and second aperture stops being part of a plurality of aperture stops which, together, intercept a marginal area that extends over substantially the entire periphery of a cross section of said propagated light beam.

12. A catadioptric optical system including in succession from an object side:

a first partial optical system having positive refractive power and for forming a primary image of an object;

a second partial optical system having positive refractive power and for forming a secondary image by light from said primary image;

a first aperture stop disposed in an optical path of said first partial optical system;

a second aperture stop disposed in an optical path of said second partial optical system; and a field stop provided at a location whereat said primary image is formed and having an opening therein;

wherein a beam of light incident on said aperture stops, respectively, is partially intercepted thereby, and wherein each of said aperture stops is constructed to intercept only a marginal portion of a cross-section of the incident beam that extends over less than an entire periphery of said cross-section, the marginal portion partially intercepted by the first aperture stop and the marginal portion partially intercepted by the second aperture stop corresponding to different partial marginal portions of a light beam propagated through said first and second partial optical systems, each of said first and second aperture stops being part of a plurality of aperture stops which, together, intercept a marginal area that extends over substantially the entire periphery of a cross section of said propagated light beam.

\* \* \* \* \*